United States Patent
Nakayama et al.

(10) Patent No.: US 12,072,393 B2
(45) Date of Patent: Aug. 27, 2024

(54) LEAKAGE DETECTION DEVICE AND POWER SYSTEM FOR VEHICLE

(71) Applicant: SANYO Electric Co., Ltd., Osaka (JP)

(72) Inventors: Masato Nakayama, Hyogo (JP); Taisuke Hamada, Hyogo (JP)

(73) Assignee: SANYO Electric Co., Ltd., Osaka (JP)

( * ) Notice: Subject to any disclaimer, the term of this patent is extended or adjusted under 35 U.S.C. 154(b) by 137 days.

(21) Appl. No.: 17/621,177

(22) PCT Filed: Jun. 15, 2020

(86) PCT No.: PCT/JP2020/023448
§ 371 (c)(1),
(2) Date: Dec. 20, 2021

(87) PCT Pub. No.: WO2020/262084
PCT Pub. Date: Dec. 30, 2020

(65) Prior Publication Data
US 2022/0357408 A1    Nov. 10, 2022

(30) Foreign Application Priority Data

Jun. 28, 2019    (JP) ................ 2019-121505

(51) Int. Cl.
*G01R 31/52*    (2020.01)
*B60L 3/00*    (2019.01)

(52) U.S. Cl.
CPC ............ *G01R 31/52* (2020.01); *B60L 3/0046* (2013.01); *B60L 3/0069* (2013.01)

(58) Field of Classification Search
CPC ....... G01R 31/50; G01R 31/52; B60L 3/0046; B60L 3/0069

(Continued)

(56) References Cited

U.S. PATENT DOCUMENTS 6,882,511 B1 * 4/2005 Patruno ................ H02H 3/33
                                                361/96
2019/0219621 A1    7/2019 Morimoto
(Continued)

FOREIGN PATENT DOCUMENTS

JP    2002098728 A  *  4/2002
JP    2007089277 A  *  4/2007  ........... G01R 31/025
(Continued)

OTHER PUBLICATIONS

International Search Report of PCT application No. PCT/JP2020/023448 dated Sep. 1, 2020.
(Continued)

*Primary Examiner* — Jermele M Hollington
*Assistant Examiner* — Taqi R Nasir
(74) *Attorney, Agent, or Firm* — WHDA, LLP

(57) ABSTRACT

In leakage detection device, coupling capacitor has a first end connected to a current path of power storage unit connected to load in a state of being insulated from a ground. Voltage output unit generates a periodic voltage that changes periodically, and applies the periodic voltage to a second end of coupling capacitor via impedance element. Voltage output unit measures a voltage at a node between coupling capacitor and impedance element. Leakage determination unit estimates at least one of an upper peak value and a lower peak value at a certain time, calculates a peak-to-peak value between the upper peak value and the lower peak value with virtually aligned time axes, and determines presence or absence of a leakage between a current path of power storage unit and the ground.

9 Claims, 8 Drawing Sheets

(58) Field of Classification Search
USPC .......................................................... 324/509
See application file for complete search history.

(56) References Cited

U.S. PATENT DOCUMENTS

| | | | | |
|---|---|---|---|---|
| 2022/0011377 | A1* | 1/2022 | Nakayama | ............... H02H 3/17 |
| 2022/0355669 | A1* | 11/2022 | Nakayama | ............. G01R 31/52 |
| 2022/0357408 | A1* | 11/2022 | Nakayama | ............ B60L 3/0046 |
| 2022/0357409 | A1* | 11/2022 | Nakayama | ........... G01R 31/006 |
| 2022/0404432 | A1* | 12/2022 | Nakayama | ............ B60L 3/0023 |
| 2022/0413061 | A1* | 12/2022 | Nakayama | ............. H02H 3/044 |

FOREIGN PATENT DOCUMENTS

| | | | | | |
|---|---|---|---|---|---|
| JP | 2007108074 | A | * | 4/2007 | |
| JP | 2009-300400 | a | | 12/2009 | |
| JP | 2010-178422 | | | 8/2010 | |
| JP | 2010249766 | A | * | 11/2010 | |
| JP | 2015087217 | A | * | 5/2015 | |
| JP | 5871160 | B2 | * | 3/2016 | |
| JP | 2016217785 | A | * | 12/2016 | |
| JP | 2017083388 | A | * | 5/2017 | |
| JP | WO2017159053 | A1 | * | 1/2019 | |
| WO | 2017/073031 | | | 5/2017 | |
| WO | WO-2017073031 | A1 | * | 5/2017 | |
| WO | 2018/074394 | A1 | | 4/2018 | |
| WO | WO-2020170557 | A1 | * | 8/2020 | ............ B60L 3/0046 |
| WO | WO-2020262084 | A1 | * | 12/2020 | ............ B60L 3/0046 |

OTHER PUBLICATIONS

English Translation of Chinese Search Report dated Apr. 8, 2024, issued in counterpart CN application No. 202080047587.5. (3 pages).

* cited by examiner

Power supply system 5

US 12,072,393 B2

LEAKAGE DETECTION DEVICE AND POWER SYSTEM FOR VEHICLE

TECHNICAL FIELD

The present invention relates to a leakage detection device that detects a leakage of a load insulated from a ground, and a power supply system for vehicle.

BACKGROUND ART

In recent years, hybrid vehicles (HVs), plug-in hybrid vehicles (PHVs), and electric cars (EVs) have become widespread. In these electric powered vehicles, a high-voltage driving battery (traction battery) is mounted in addition to an auxiliary battery (generally, a lead battery having an output of 12 V). In order to prevent an electric shock, a high-voltage circuit including a high-voltage driving battery, an inverter, and a drive motor is insulated from a body (chassis ground) of a vehicle.

A Y capacitor is inserted between a positive wire of the high-voltage circuit on a vehicle side and the chassis ground, and a Y capacitor is inserted between a negative wire of the high-voltage circuit on the vehicle side and the chassis ground. Accordingly, power source is stably supplied from the high-voltage driving battery to a load on the vehicle side. A leakage detection device that detects a leakage by monitoring an insulation resistance between the high-voltage circuit and the chassis ground is mounted on the vehicle.

In an AC type leakage detection device, the presence or absence of a leakage is detected by applying a pulse voltage to a positive-electrode terminal or a negative-electrode terminal of a driving battery via a resistor and a coupling capacitor, and measuring a voltage at a node between the resistor and the coupling capacitor (see, for example, PTL 1).

CITATION LIST

Patent Literature

PTL 1: Unexamined Japanese Patent Publication No. 2010-178422

SUMMARY OF THE INVENTION

In the above configuration in the AC system, the voltage at the measurement point may deviate from the measurement range at the time of a sudden change in the leakage state such as opening and closing of a main relay (contactor) connected between the battery and the vehicle. In the process in which the voltage at the measurement point returns to the measurement range, a period in which the voltage waveform at the measurement point rises or falls at a constant speed occurs. During this period, the peak-to-peak value between the upper peak value and the lower peak value of the voltage waveform at the measurement point expands and contracts regardless of the influence of noise, and it is difficult to stably detect the leakage.

The present disclosure has been made in view of such a situation, and an object of the present disclosure is to provide a technology that enables highly accurate a leakage detection in a leakage detection device even when a voltage waveform at a measurement point rises or falls as a whole.

In order to solve the above problem, a leakage detection device according to an aspect of the present disclosure includes a coupling capacitor including a first end that is connected to a current path of a power storage unit connected to a load in a state of being insulated from a ground, a voltage output unit that generates a periodic voltage that changes periodically, where the voltage output unit applies the periodic voltage to a second end of the coupling capacitor via an impedance element, a voltage measurement unit configured to measure a voltage at a node between the coupling capacitor and the impedance element, and a leakage determination unit configured to determine presence or absence of a leakage between a current path of the power storage unit and the ground based on the peak-to-peak value between the upper peak value and the lower peak value of the voltage waveform measured by the voltage measurement unit. The leakage determination unit estimates at least one of the upper peak value and the lower peak value at a certain time, and calculates a peak-to-peak value between the upper peak value and the lower peak value with virtually aligned time axes.

According to the present disclosure, in the leakage detection device, the leakage can be detected with high accuracy even when the voltage waveform at the measurement point rises or falls as a whole.

BRIEF DESCRIPTION OF THE DRAWINGS

FIG. 3 is a diagram illustrating an example of a measured voltage waveform when a main relay is turned on.

DESCRIPTION OF EMBODIMENT

Figure 1:
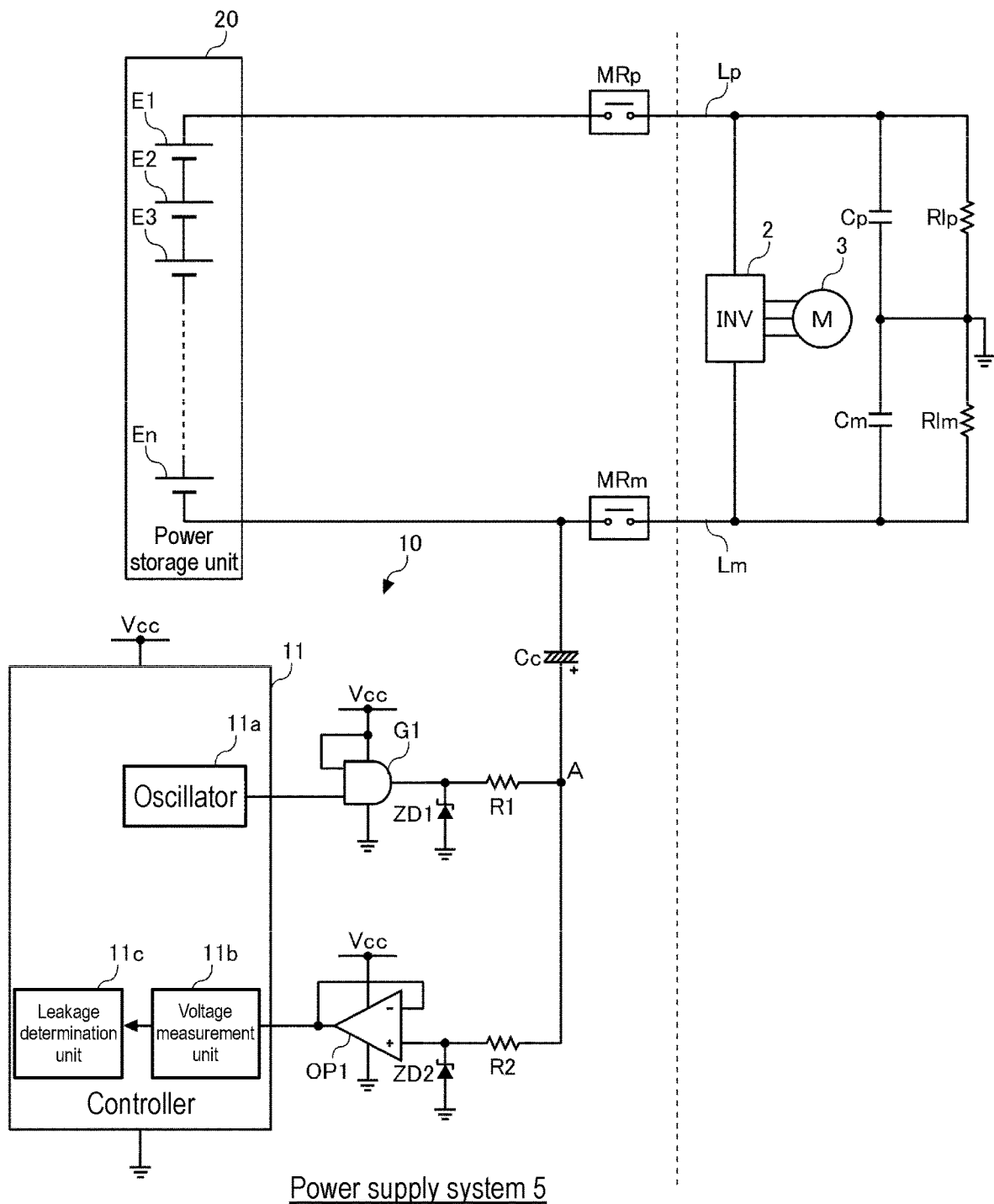
FIG. 1 is a diagram for describing a configuration of a power supply system including a leakage detection device according to an exemplary embodiment.

FIG. 1 is a diagram for describing a configuration of power supply system 5 including leakage detection device 10 according to an exemplary embodiment. Power supply system 5 is mounted on an electric powered vehicle. Power supply system 5 is provided separately from an auxiliary battery (generally, a lead battery having an output of 12 V being used) in the electric powered vehicle. Power supply system 5 includes high-voltage power storage unit 20 and leakage detection device 10. Power storage unit 20 includes a plurality of cells E1 to En connected in series. As the cell, a lithium ion battery cell, a nickel hydride battery cell, a lead battery cell, an electric double layer capacitor cell, a lithium ion capacitor cell, or the like can be used. Hereinafter, an example using lithium ion battery cells (nominal voltage: from 3.6 V to 3.7 V, inclusive) is assumed in this description.

The electric powered vehicle includes inverter 2 and motor 3 as high-voltage loads. A positive electrode of power storage unit 20 and first end of inverter 2 are connected to each other by positive wire Lp, and a negative electrode of power storage unit 20 and a second end of inverter 2 are connected to each other by negative wire Lm. Positive-side main relay MRp is inserted into positive wire Lp, and negative-side main relay MRm is inserted into negative wire Lm. Positive-side main relay MRp and negative-side main relay MRm function as contactors that control conduction and disconnection between power storage unit 20 and the high-voltage loads in the electric powered vehicle. In place of these relays, semiconductor switches having a high withstand voltage and high insulation can be used.

Inverter 2 is a bidirectional inverter that is connected between power storage unit 20 and motor 3. At the time of power running, inverter 2 converts DC power supplied from power storage unit 20 into AC power and supplies the AC power to motor 3. At the time of regeneration, inverter 2 converts AC power supplied from motor 3 into DC power and supplies the DC power to power storage unit 20. For example, a three-phase AC motor is used as motor 3. Motor 3 rotates corresponding to AC power supplied from inverter 2 at the time of power running. At the time of regeneration, rotational energy generated by deceleration is converted into AC power and the AC power is supplied to inverter 2.

Power storage unit 20 is mounted on the electric powered vehicle in a state where power storage unit 20 is insulated from a chassis ground of the electric powered vehicle. The auxiliary battery is mounted on the electric powered vehicle in a state where a negative electrode is electrically conductive with the chassis ground. Positive wire Lp closer to inverter 2 than positive-side main relay MRp and the chassis ground are connected to each other via positive-side Y capacitor Cp. Negative wire Lm closer to inverter 2 than negative-side main relay MRm and the chassis ground are connected to each other via negative-side Y capacitor Cm.

Positive-side Y capacitor Cp has a function of galvanically insulating positive wire Lp and the chassis ground from each other and a function of stabilizing a voltage of positive wire Lp. Negative-side Y capacitor Cm has a function of galvanically insulating negative wire Lm and the chassis ground from each other and a function of stabilizing a voltage of negative wire Lm.

When power storage unit 20 is ideally insulated from the chassis ground, an intermediate potential of power storage unit 20 is maintained around a potential of the chassis ground. For example, when a voltage across terminals of power storage unit 20 is 250 V, a positive electrode potential of power storage unit 20 is maintained around +125 V, and a negative electrode potential is maintained around −125 V. When a human touches an exposed conducting part of the electric powered vehicle in a state where high-voltage power storage unit 20 and the chassis ground are electrically conductive with each other, there is a risk that the human receives an electric shock. In view of the above, in the electric powered vehicle on which high-voltage power storage unit 20 is mounted, it is necessary to mount leakage detection device 10 on the electric powered vehicle so as to monitor an insulation state between a current path of power storage unit 20 connected to a high-voltage vehicle load and the chassis ground. In FIG. 1, an insulation state between positive wire Lp and the chassis ground is represented as positive-side leakage resistance Rlp, and an insulation state between negative wire Lm and the chassis ground is represented as negative-side leakage resistance Rlm.

Leakage detection device 10 includes coupling capacitor Cc, first resistor R1, AND gate G1, first Zener diode ZD1, second resistor R2, first operational amplifier OP1, second Zener diode ZD2, and controller 11. Controller 11 includes oscillator 11a, voltage measurement unit 11b, and leakage determination unit 11c. Controller 11 may include, for example, a microcomputer and a nonvolatile memory (for example, an electrically erasable programmable read-only memory (EEPROM) or a flash memory).

A first end of coupling capacitor Cc is connected to the current path of power storage unit 20. In the example illustrated in FIG. 1, the first end of coupling capacitor Cc is connected to the negative electrode of power storage unit 20. The first end of coupling capacitor Cc may be connected to the positive electrode of power storage unit 20, or may be connected to a node of any of the plurality of cells E1 to En in power storage unit 20. A second end of coupling capacitor Cc is connected to an output terminal of a voltage output unit via first resistor R1. A node between the second end of coupling capacitor Cc and first resistor R1 is measurement point A. In place of first resistor R1, another impedance element may be used.

In FIG. 1, as coupling capacitor Cc, an aluminum electrolytic capacitor capable of increasing a capacity at a relatively low cost is used. The aluminum electrolytic capacitor has polarity. In FIG. 1, a positive electrode of the aluminum electrolytic capacitor is connected to measurement point A, and a negative electrode of the aluminum electrolytic capacitor is connected to the negative electrode of power storage unit 20. Coupling capacitor Cc may be configured by connecting a plurality of aluminum electrolytic capacitors in series. In this case, when a short-circuit failure occurs in one capacitor, galvanic insulation can be maintained by the remaining capacitors.

The voltage output unit generates a periodically changing periodic voltage, and applies the generated periodic voltage to the second end of coupling capacitor Cc via first resistor R1. Hereinafter, an example in which a rectangular wave voltage is used as the periodic voltage is assumed.

The voltage output unit includes oscillator 11a and AND gate G1. Oscillator 11a includes a multivibrator or a local oscillator, and generates a rectangular wave having a preset frequency. The rectangular wave voltage generated by oscillator 11a is input to a first input terminal of AND gate G1. A second input terminal of AND gate G1 is connected to power source potential Vcc. AND gate G1 outputs a high level (power source potential Vcc) when the rectangular wave voltage input to the first input terminal is at a high level, and outputs a low level (ground electric potential) when the rectangular wave voltage input to the first input terminal is at a low level. The ground electric potential is connected to the chassis ground. Hereinafter, an example in which power source potential Vcc is 5 V and the ground electric potential is 0 V will be assumed.

AND gate G1 functions as a buffer that separates controller 11 and measurement point A. AND gate G1 is an example of a buffer. For example, an OR gate or a voltage follower may be used instead of the AND gate. When an OR gate is used, the ground electric potential is connected to a second input terminal of the OR gate.

First Zener diode ZD1 is connected between the chassis ground and a node between an output terminal of AND gate G1 and first resistor R1.

Measurement point A is connected to a non-inverting input terminal of first operational amplifier OP1 via second resistor R2. The inverting input terminal and an output terminal of first operational amplifier OP1 are connected to each other. First operational amplifier OP1 functions as a voltage follower that performs only impedance conversion with an amplification factor of one time. First operational amplifier OP1 outputs a voltage at measurement point A to voltage measurement unit 11b. Second Zener diode ZD2 is connected between the chassis ground and a node between the non-inverting input terminal of first operational amplifier OP1 and second resistor R2.

First Zener diode ZD1 or second Zener diode ZD2 prevents an overvoltage from being applied to AND gate G1 or first operational amplifier OP11 due to opening or closing of main relays MRp, MRm or the fluctuation of a load of power supply system 5.

Voltage measurement unit 11b measures a voltage at measurement point A. Voltage measurement unit 11b includes an A/D converter, and the A/D converter samples an analog voltage at measurement point A at the timing synchronized with the timing of a rising edge and a falling edge of the rectangular wave voltage generated by oscillator 11a, and converts the sampled analog voltage into a digital value. The voltage sampled at the timing of the rising edge of the rectangular wave voltage corresponds to a lower peak value of a measured voltage waveform, and the voltage sampled at the timing of the falling edge of the rectangular wave voltage corresponds to an upper peak value of the measured voltage waveform. In consideration of blunting of the rectangular wave voltage, the timing at which the lower peak value is to be sampled and the timing at which the upper peak value is to be sampled may be adjusted. The A/D converter outputs a digital value obtained by converting the analog voltage at measurement point A to leakage determination unit 11c.

Leakage determination unit 11c determines presence or absence of a leakage between the current path of power storage unit 20 and the chassis ground on the basis of the voltage at measurement point A measured by voltage measurement unit 11b. When a peak-to-peak value indicated by a difference between the upper peak value and the lower peak value is smaller than a set value, leakage determination unit 11c determines that a leakage has occurred between the current path of power storage unit 20 and the chassis ground. The set value is determined on the basis of the peak-to-peak value of the measured voltage waveform at a time of occurrence of the leakage derived in advance by an experiment or simulation carried out by a designer. When the leakage occurs between the current path of power storage unit 20 and the chassis ground, an AC current flows from AND gate G1 to coupling capacitor Cc via first resistor R1 acting as a detection resistance. When the current flows through first resistor R1, a voltage amplitude at measurement point A decreases due to a voltage drop.

In the exemplary embodiment, leakage determination unit 11c estimates at least one of the upper peak value and the lower peak value at a certain time, and calculates a peak-to-peak value between the upper peak value and the lower peak value with virtually aligned time axes.

Control Example 1

In Control Example 1, leakage determination unit 11c calculates a virtual lower peak value by averaging a voltage value measured at a time to be measured temporally immediately before a specific upper peak value and a voltage value measured at a time to be measured temporally immediately after the specific upper peak value. Leakage determination unit 11c calculates a peak-to-peak value between the specific upper peak value and the virtual lower peak value.

In addition, leakage determination unit 11c calculates a virtual upper peak value by averaging a voltage value measured at a time to be measured temporally immediately before a specific lower peak value and a voltage value measured at a time to be measured temporally immediately after the specific lower peak value. Leakage determination unit 11c calculates a peak-to-peak value between the specific lower peak value and the virtual upper peak value.

Figure 2A:
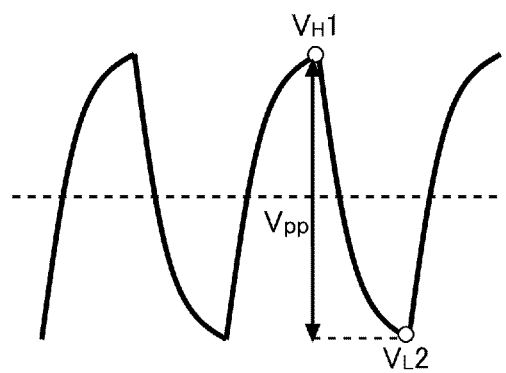
FIG. 2A is diagram for explaining a difference in a method of calculating a peak-to-peak value of a measured voltage waveform between a comparative example and Control Example 1.
Figure 2B:
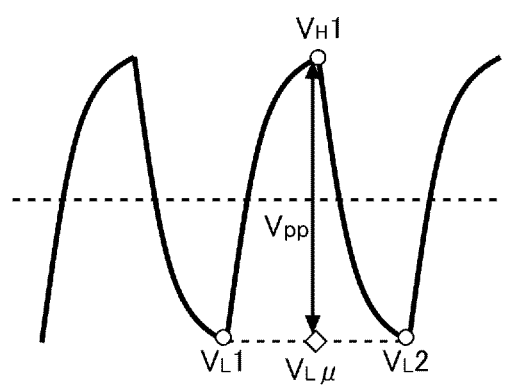
FIG. 2B is diagram for explaining a difference in a method of calculating a peak-to-peak value of a measured voltage waveform between a comparative example and Control Example 1.

FIGS. 2A and 2B are diagrams for describing a difference in a method of calculating a peak-to-peak value of a measured voltage waveform between the comparative example and Control Example 1. FIG. 2A illustrates a method of calculating a peak-to-peak value of a measured voltage waveform in a comparative example, and FIG. 2B illustrates a method of calculating a peak-to-peak value of a measured voltage waveform in Control Example 1. In the comparative example illustrated in FIG. 2A, a difference between two temporally adjacent upper peak value $V_H1$ and lower peak value $V_L2$ measured is defined as peak-to-peak value Vpp. In Control Example 1 illustrated in FIG. 2B, a difference between measured upper peak value $V_H1$ and lower peak average value $V_L\mu$ obtained by averaging lower peak value $V_L1$ and lower peak value $V_L2$ with upper peak value $V_H1$ interposed therebetween is defined as peak-to-peak value Vpp. In the former case, the timing of upper peak value $V_H1$ and lower peak value $V_L2$ do not correspond to each other, but in the latter case, the timing of upper peak value $V_H1$ and lower peak average value $V_L\mu$ correspond to each other.

Figure 3:
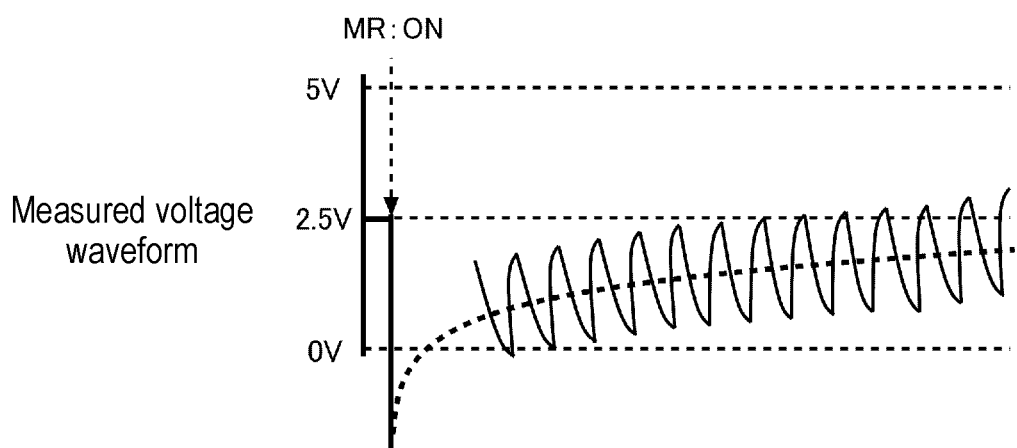

FIG. 3 is a diagram illustrating an example of measured voltage waveforms when main relays MRp and MRm are turned on. When main relays MRp and MRm are turned on, the voltage of power storage unit 20 greatly fluctuates, and accordingly, a charging current flows from the voltage output unit to coupling capacitor Cc via first resistor R1. In this case, the voltage at measurement point A greatly decreases and greatly deviates below an input voltage range (from 0 V to 5 V, inclusive) of first operational amplifier OP1 that defines a measurement range of voltage measurement unit 11b. The voltage waveform at measurement point A rises from the outside of the measurement range as the charging current of the coupling capacitor Cc decreases. It rises steeply at the beginning, and gradually rises at a constant speed from the middle. When the charging of coupling capacitor Cc is completed, the center voltage at measurement point A returns to the intermediate potential (2.5 V) of the measurement range. When leakage resistance Rlp is large, it may take 30 seconds or more for the entire voltage waveform at measurement point A to return to the measurement range (0 V to 5 V).

Note that the voltage at measurement point A is deviated above the measurement range in some cases. When main relays MRp and MRm are turned on or off in a state where coupling capacitor Cc is charged for some reason, a discharge current flows from coupling capacitor Cc toward the voltage output unit via first resistor R1. In this case, the voltage at measurement point A greatly increases and greatly deviates above the measurement range. The voltage waveform at measurement point A drops from the outside of the measurement range as the discharge current of coupling capacitor Cc decreases. First, it steeply falls, and gradually falls at a constant speed from the middle. When the discharge of coupling capacitor Cc is completed, the center voltage at measurement point A returns to the intermediate potential (2.5 V) of the measurement range.

Figure 4A:
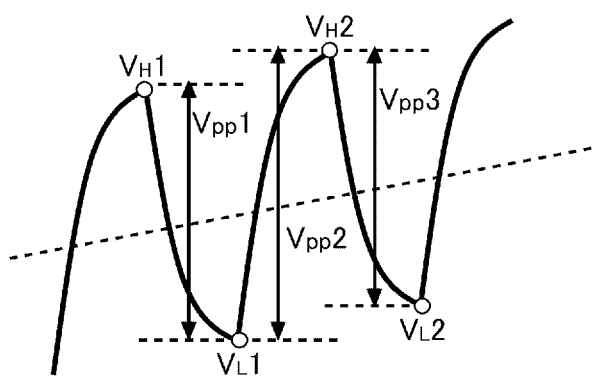
FIG. 4A is diagram for describing a behavior of the peak-to-peak value when the measured voltage waveform rises at a constant speed in the comparative example and Control Example 1.
Figure 4B:
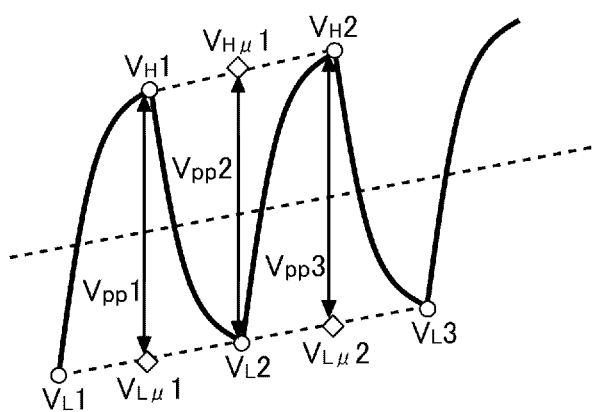
FIG. 4B is diagram for describing a behavior of the peak-to-peak value when the measured voltage waveform rises at a constant speed in a comparative example and Control Example 1.

FIGS. 4A and 4B are diagrams for describing a behavior of the peak-to-peak value when the measured voltage waveform rises at a constant speed in the comparative example and Control Example 1. FIG. 4A illustrates a behavior of the peak-to-peak value in the comparative example, and FIG. 4B illustrates a behavior of the peak-to-peak value in Control Example 1.

In the comparative example, the amplitude of peak-to-peak value Vpp increases or decreases in the process of rising of the measured voltage waveform. In the example illustrated in FIG. 4A, first peak-to-peak value Vpp1 defined by a difference between first upper peak value $V_H 1$ and first lower peak value $V_L 1$ is smaller than second peak-to-peak value Vpp2 defined by a difference between second upper peak value $V_H 2$ and first lower peak value $V_L 1$. Second peak-to-peak value Vpp2 is larger than third peak-to-peak value Vpp3 defined by a difference between second upper peak value $V_H 2$ and second lower peak value $V_L 2$. As described above, in the comparative example, the entire measured voltage waveform rises while the amplitude of peak-to-peak value Vpp alternately repeats the increase and decrease. The increase and decrease of the amplitude of peak-to-peak value Vpp occur regardless of the influence of noise.

In Control Example 1, the amplitude of peak-to-peak value Vpp is kept constant in the process of rising of the measured voltage waveform. In the example illustrated in FIG. 4B, the amplitudes of first peak-to-peak value Vpp1 defined by a difference between first upper peak value $V_H 1$ and first lower peak average value $V_H \mu 1$, second peak-to-peak value Vpp2 defined by a difference between first upper peak average value $V_H \mu 1$ and second lower peak value $V_L 2$, and third peak-to-peak value Vpp3 defined by a difference between second upper peak value $V_H 2$ and second lower peak average value $V_L \mu 2$ are substantially equal. As described above, in Control Example 1, the entire measured voltage waveform rises while the amplitude of peak-to-peak value Vpp is kept constant.

In Control Example 1, leakage determination unit 11c can compare two adjacent peak-to-peak values Vpp to evaluate reliability of the leakage determination. Leakage determination unit 11c validates the leakage determination when the two adjacent peak-to-peak values Vpp correspond to each other, and invalidates the leakage determination when the two adjacent peak-to-peak values Vpp do not correspond to each other. In Control Example 1, when the voltage at measurement point A is an ideal voltage that is not affected by noise, two adjacent peak-to-peak values Vpp should be substantially equal. Conversely, when two adjacent peak-to-peak values Vpp do not substantially coincide with each other, it can be said that the voltage at measurement point A is greatly affected by noise. It can be said that the leakage determination based on the voltage at measurement point A greatly affected by the noise has low reliability. Therefore, results of the leakage determination executed in such a state of low reliability is treated as invalid. Alternatively, in a state where the reliability is low, the leakage determination itself is stopped.

Figure 5A:
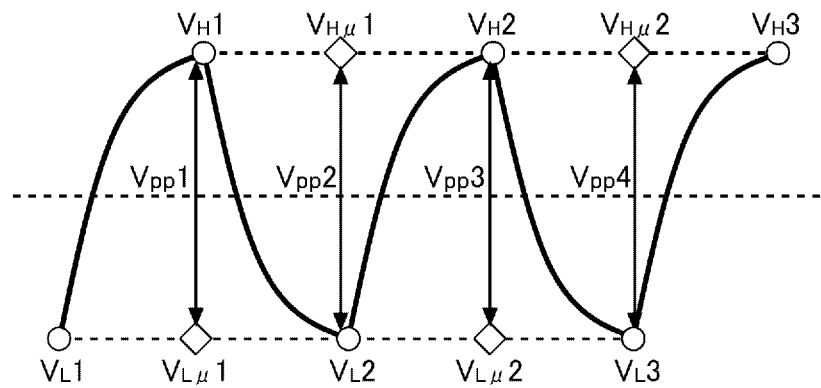
FIG. 5A is diagram for describing a specific example of reliability evaluation of a leakage determination using two adjacent peak-to-peak values.
Figure 5B:
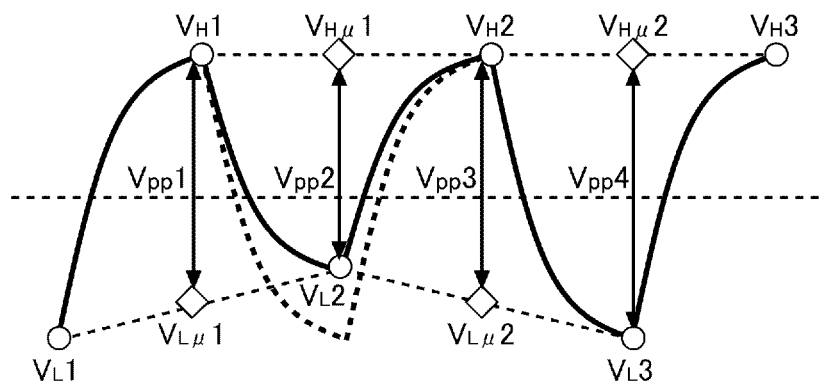
FIG. 5B is diagram for describing a specific example of reliability evaluation of a leakage determination using two adjacent peak-to-peak values.

FIGS. 5A and 5B are diagrams for describing a specific example of reliability evaluation of the leakage determination using two adjacent peak-to-peak values Vpp. When motor 3 in the electric powered vehicle starts regenerative power generation, the voltage of power storage unit 20 instantaneously increases by electric power generated by motor 3. When the electric powered vehicle accelerates, a rotation speed of motor 3 increases, and the voltage of power storage unit 20 instantaneously decreases due to the increase in power supplied to motor 3. Such instantaneous voltage fluctuation of power storage unit 20 passes through coupling capacitor Cc as vehicle noise and is superimposed on the voltage at measurement point A.

FIG. 5A illustrates a measured voltage waveform in a case where noise is not superimposed. In FIG. 5A, first peak-to-peak value Vpp1 and second peak-to-peak value Vpp2 that are adjacent to each other, second peak-to-peak value Vpp2 and third peak-to-peak value Vpp3 that are adjacent to each other, and third peak-to-peak value Vpp3 and fourth peak-to-peak value Vpp4 that are adjacent to each other substantially coincide with each other. As illustrated in FIG. 4B, when the entire measured voltage waveform fluctuates (that is, it varies with a sufficiently long period) at a constant speed, the measured voltage waveforms coincide with each other.

FIG. 5B illustrates a measured voltage waveform in a case where noise is superimposed. In FIG. 5B, regenerative power generation by motor 3 occurs near the timing when second lower peak value $V_L 2$ is measured, and second lower peak value $V_L 2$ is detected as a value higher than the original value due to the influence of noise. In this case, second peak-to-peak value Vpp2 using second lower peak value $V_L 2$ is smaller than adjacent first peak-to-peak value Vpp1 or adjacent third peak-to-peak value Vpp3. In the leakage determination using second peak-to-peak value Vpp2, there is a possibility that it is erroneously determined that the leakage occurs although no leakage occurs. In Control Example 1, in a case where the adjacent peak-to-peak values Vpp do not substantially coincide with each other, the leakage determination is invalid, so that the erroneous determination can be avoided.

As described above, according to Control Example 1, a peak value without the average processing is used as one peak value of peak-to-peak value Vpp, and a peak value obtained by averaging the peak values before and after the peak value without the average processing is used as the other peak value. As a result, one peak value and the other peak value of peak-to-peak value Vpp can be approximately the voltage values acquired at the same time. By using peak-to-peak value Vpp based on the upper peak value and the lower peak value virtually acquired at the same time, even in a case where the voltage waveform at measurement point A rises or falls at a constant speed as a whole, the stable leakage detection can be performed.

Therefore, after the voltage at measurement point A deviates from the measurement range, when the entire measured voltage waveform returns to a state of falling within the measurement range and fluctuates in a long period sufficient not to affect the leakage determination, the highly accurate leakage determination can be performed from the stage before the center potential of the measured voltage returns to the intermediate potential (2.5 V) of the measurement range. This can shorten a period during which the leakage determination cannot be made.

In addition, when the measurement voltage fluctuates in a sufficiently long period, two adjacent peak-to-peak values Vpp substantially coincide with each other. From this property, presence or absence of the influence of noise can be determined by comparing two adjacent peak-to-peak values Vpp.

Control Example 2

In Control Example 2, leakage determination unit 11c calculates a virtual upper peak value by weighted-averaging a plurality of voltage values measured at a plurality of times when the upper peak value is to be measured, and calculates a virtual lower peak value having a time axis aligned with that of the virtual upper peak value by weighted-averaging a plurality of voltage values measured at a plurality of times when the lower peak value is to be measured. Leakage determination unit 11c calculates peak-to-peak value Vpp between the calculated virtual upper peak value and the calculated lower virtual peak value.

Figure 6A:
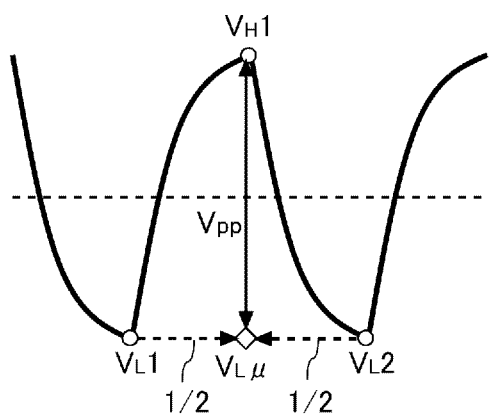
FIG. 6A is diagram for describing a difference in a method of calculating a peak-to-peak value of a measured voltage waveform between Control Example 1 and Control Example 2.
Figure 6B:
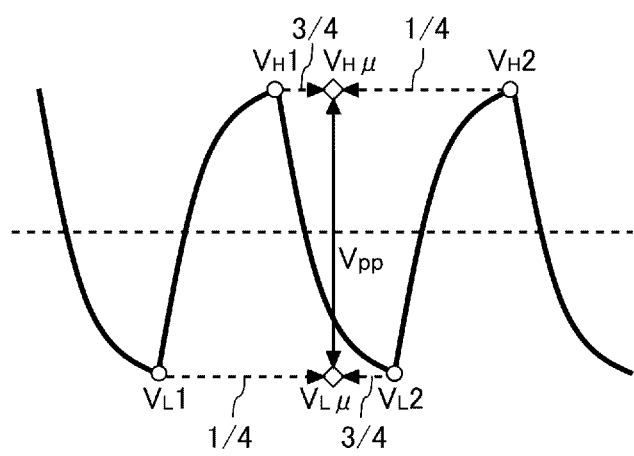
FIG. 6B is diagram for describing a difference in a method of calculating a peak-to-peak value of a measured voltage waveform between Control Example 1 and Control Example 2.

FIGS. 6A and 6B are diagrams for describing a difference in a method of calculating a peak-to-peak value of a measured voltage waveform between Control Example 1 and Control Example 2. FIG. 6A illustrates a method of calculating a peak-to-peak value of a measured voltage waveform in Control Example 1, and FIG. 6B illustrates a method of calculating a peak-to-peak value of a measured voltage waveform in Control Example 2. In Control Example 1 illustrated in FIG. 6A, upper peak value $V_H1$ is derived without the average processing, and lower peak value $V_L\mu$ is derived by the average process of two points with upper peak value $V_H1$ interposed therebetween.

In Control Example 2 illustrated in FIG. 6B, upper peak value $V_H\mu$ and lower peak value $V_L\mu$ are derived by performing the weighted-average so that the time axes of upper peak value $V_H\mu$ and lower peak value $V_L\mu$ are aligned. For example, leakage determination unit 11c derives upper peak value $V_H\mu$ and lower peak value $V_L\mu$ virtually acquired at the same time using a finite impulse response (FIR) filter. For example, the following Equation 1 and Equation 2 are calculated to derive upper peak value $V_H\mu$ and lower peak value $V_L\mu$.

$$V_H\mu = (V_H1 \times 3/4) + (V_H2 \times 1/4) \quad \text{(Equation 1)}$$

$$V_L\mu = (V_L1 \times 1/4) + (V_L2 \times 3/4) \quad \text{(Equation 2)}$$

Figure 7A:
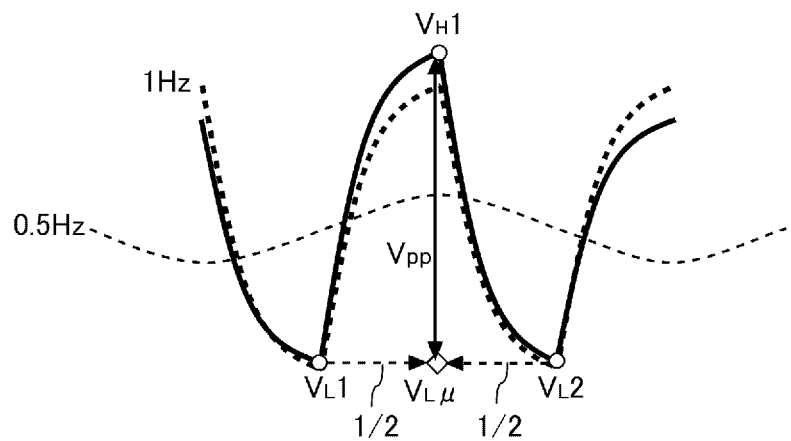
FIG. 7A is waveform diagram illustrating an example of a peak-to-peak value with respect to a frequency of a measured voltage in each of Control Example 1 and Control Example 2.
Figure 7B:
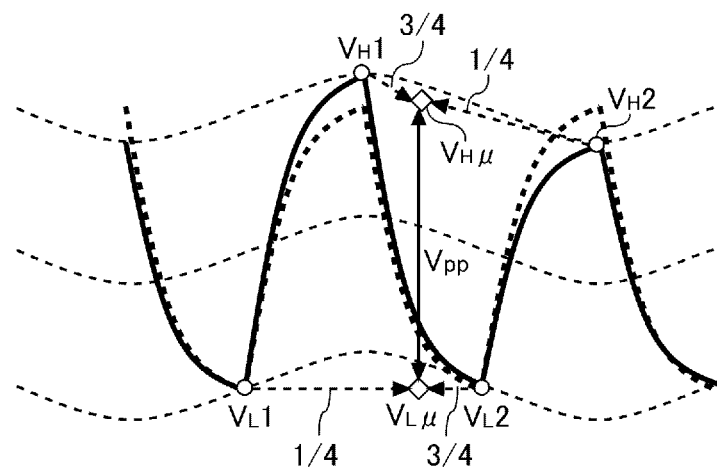
FIG. 7B is waveform diagram illustrating an example of a peak-to-peak value with respect to a frequency of a measured voltage in each of Control Example 1 and Control Example 2.
Figure 8A:
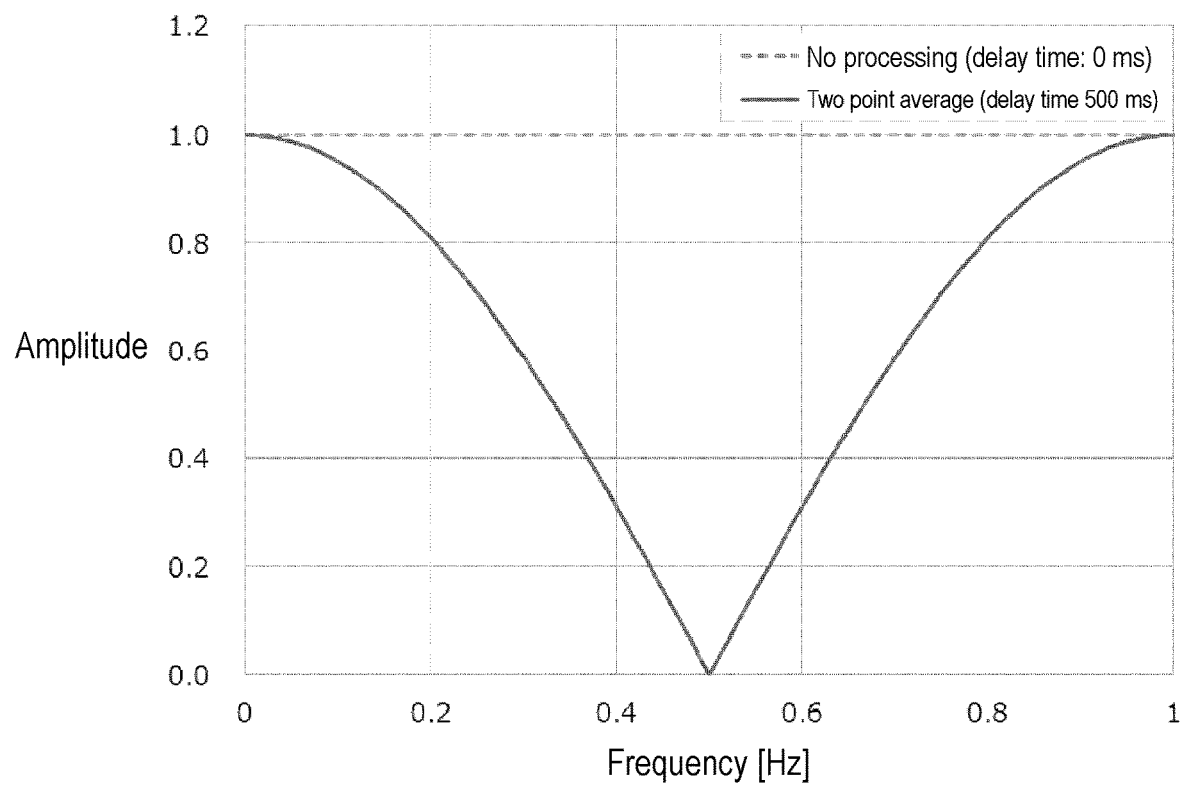
FIG. 8A is graph illustrating an example of a gain characteristic with respect to the frequency of the measurement voltage in each of Control Example 1 and Control Example 2.
Figure 8B:
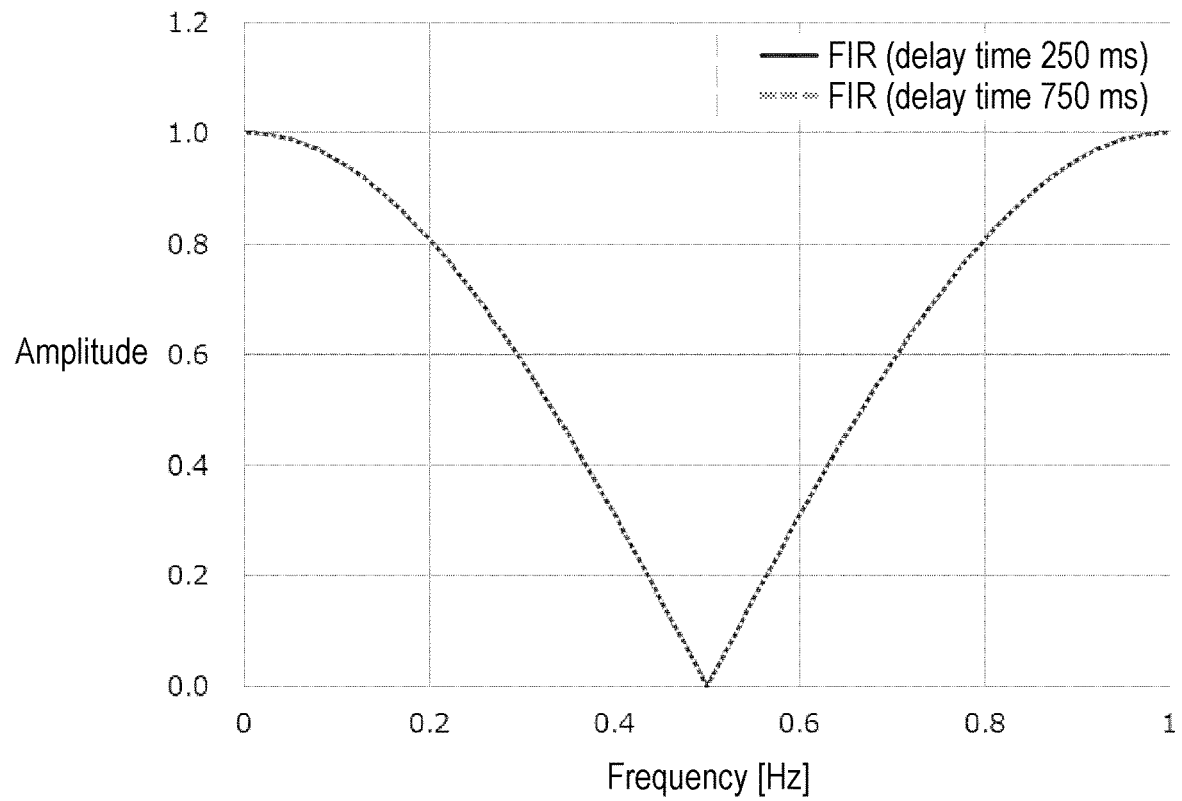
FIG. 8B is graph illustrating an example of a gain characteristic with respect to the frequency of the measurement voltage in each of Control Example 1 and Control Example 2.

FIGS. 7A and 7B are waveform diagrams illustrating an example of a peak-to-peak value with respect to a frequency of a measured voltage in each of Control Example 1 and Control Example 2. FIGS. 8A and 8B is graph illustrating an example of a gain characteristic with respect to the frequency of the measurement voltage in each of Control Example 1 and Control Example 2. In FIGS. 7A and 7B, a thick dotted line indicates an ideal voltage waveform on which no noise is superimposed. A thick solid line indicates an actually measured voltage waveform on which noise is superimposed. In FIGS. 8A and 8B, a dotted line indicates the gain characteristic of the upper peak value, and a solid line indicates the gain characteristic of the lower peak value.

In Control Example 1, as illustrated in FIGS. 7A and 8A, lower peak value $V_L\mu$ is average processed, but upper peak value $V_H1$ is not average processed. Since lower peak value $V_L\mu$ is average processed, noise is reduced around a frequency of half the reference frequency. On the other hand, noise is not reduced in the upper peak value $V_H1$. In FIG. 8A the difference in the vertical direction between the dotted line and the solid line is an error. In the example illustrated in FIGS. 7A and 8A, the error is maximized when the frequency is 0.5 Hz.

In Control Example 2, as illustrated in FIGS. 7B and 8B, the FIR filter is applied to both upper peak value $V_H\mu$ and lower peak value $V_L\mu$. Therefore, in addition to the phase characteristic, the gain characteristic with respect to the frequency can be matched between upper peak value $V_H\mu$ and lower peak value $V_L\mu$. Therefore, the influence of noise can be reduced. When FIG. 7A is compared with FIG. 7B, it can be seen that peak-to-peak value Vpp of the thick solid line illustrated in FIG. 7B is closer to the peak-to-peak value of the ideal voltage waveform than that in FIG. 7A.

As described above, according to Control Example 2, the upper peak value and the lower peak value of peak-to-peak value Vpp are calculated by performing the weighted average as if acquired virtually at the same time. As a result, the gain characteristic with respect to the frequency can be matched, and the noise resistance can be improved. When the peak-to-peak value based on the upper peak value and the lower peak value which are simply averaged are used without the time axes aligned, the stable leakage detection cannot be performed when the measured voltage waveform rises or falls at a constant speed as a whole as illustrated in FIG. 4A.

The present disclosure is described above according to the exemplary embodiments. It will be understood by the person of ordinary skill in the art that the exemplary embodiments are merely an example, other modified examples in which configuration elements and processing processes of the exemplary embodiments are variously combined are possible, and the other modified examples still fall within the scope of the present disclosure.

In Control Examples 1 and 2 described above, an example of calculating the upper peak value and/or the lower peak value by the filter process with two points is described. In this regard, the upper peak value and/or the lower peak value may be calculated by the filter process with three or more points. In any case, the time axes of the upper peak value and the lower peak value may be aligned. In the example in which the upper peak value and/or the lower peak value is calculated by the filter process with two points, the leakage can be detected earliest. The reliability is basically improved as the number of sample points used for the filter process is increased.

In the exemplary embodiments, an example has been described in which the rectangular wave voltage is applied from the voltage output unit to coupling capacitor Cc via first resistor R1. In this regard, a sinusoidal signal voltage may be applied to coupling capacitor Cc. Still in this case, leakage determination unit 11c can specify the reference potential, the upper peak value, and the lower peak value from the voltage at measurement point A, and determine the presence or absence of a leakage as in the exemplary embodiments.

In the above-described exemplary embodiment, a description has been given to an example in which leakage detection device 10 is mounted on an electric powered vehicle and used. In this regard, leakage detection device 10 according to the exemplary embodiment can also be applied to applications other than an in-vehicle application. The load may be any load as long as power storage unit 20 and the load that receives power supply from power storage unit 20 are insulated from the ground. For example, the load may be a load used in a railway vehicle.

Note that, the exemplary embodiments may be specified by the following Items.

[Item 1]

Leakage detection device (10) including coupling capacitor (Cc) having a first end connected to a current path of power storage unit (20) connected to load (2) in a state of being insulated from a ground, voltage output unit (11a, G1) configured to generate a periodically changing periodic voltage to apply the periodic voltage to a second end of coupling capacitor (Cc) via impedance element (R1), voltage measurement unit (11b) configured to measure a voltage at a node between coupling capacitor (Cc) and impedance element (R1), and leakage determination unit (11c) configured to determine presence or absence of a leakage between a current path of power storage unit (20) and the ground based on a peak-to-peak value between an upper peak value and a lower peak value of a voltage waveform measured by voltage measurement unit (11b), wherein leakage determination unit (11c) estimates at least one of an upper peak value and a lower peak value at a certain time, and calculates a peak-to-peak value between an upper peak value and a lower peak value with virtually aligned time axes.

According to this, even when the voltage waveform at the measurement point rises or falls as a whole, highly accurate electric leak detection can be performed.

[Item 2]

Leakage detection device (10) according to Item 1, wherein leakage determination unit (11c) calculates a virtual lower peak value by averaging a voltage value measured at a time to be measured temporally immediately before a specific upper peak value and a voltage value measured at a time to be measured temporally immediately after the specific upper peak value, and calculates a peak-to-peak value between the specific upper peak value and the virtual lower peak value.

According to this, when the voltage waveform at the measurement point rises or falls as a whole, it is possible to detect the leakage with low delay.

[Item 3]

Leakage detection device (10) according to Item 1, wherein leakage determination unit (11c) calculates a virtual upper peak value by averaging a voltage value measured at a time to be measured temporally immediately before a specific lower peak value and a voltage value measured at a time to be measured temporally immediately after the specific lower peak value, and calculates a peak-to-peak value between the specific lower peak value and the virtual upper peak value.

According to this, when the voltage waveform at the measurement point rises or falls as a whole, it is possible to detect the leakage with low delay.

[Item 4]

Leakage detection device (10) according to Item 1, wherein leakage determination unit (11c) calculates a virtual upper peak value by weighted-averaging a plurality of voltage values measured at a plurality of times when an upper peak value is to be measured, calculates a virtual lower peak value having a time axis aligned with a time axis of the virtual upper peak value by weighted-averaging a plurality of voltage values measured at a plurality of times when a lower peak value is to be measured, and calculates a peak-to-peak value between the virtual upper peak value and the virtual lower peak value.

According to this, when the voltage waveform at the measurement point rises or falls as a whole, the leakage detection with high noise resistance can be performed.

[Item 5]

Leakage detection device (10) according to any one of Items 1 to 4, wherein leakage determination unit (11c) compares two adjacent peak-to-peak values to evaluate reliability of a leak determination of a current path of power storage unit (20).

Thus, an influence of noise can be checked.

[Item 6]

Power supply system for vehicle (5) including power storage unit (20) that is mounted in a state of being insulated from a chassis ground of a vehicle and is configured to supply power to load (2) in the vehicle, and leakage detection device (10) according to any one of Items 1 to 5.

According to this, it is possible to realize power supply system for vehicle (5) including leakage detection device (10) capable of highly accurate leakage detection even when the voltage waveform at the measurement point rises or falls as a whole.

REFERENCE MARKS IN THE DRAWING 2 inverter
3 motor
Lp positive wire
Lm negative wire
Cp positive-side Y capacitor
Cm negative-side Y capacitor
Rlp positive-side leakage resistance
Rlm negative-side leakage resistance
5 power supply system
20 power storage unit
E1 to Encell
10 leakage detection device
11 controller
11a oscillator
11b voltage measurement unit
11c leakage determination unit
Cc coupling capacitor
R1 first resistor
R2 second resistor
OP1 first operational amplifier
G1 AND gate
ZD1 first Zener diode
ZD2 second Zener diode

The invention claimed is:

1. A leakage detection device comprising:
in a state of being insulated from a ground, a coupling capacitor including a first end connected to a current path of a power storage unit connected to a load;
a voltage output unit configured to generate a periodic voltage that periodically changes to apply the periodic voltage to a second end of the coupling capacitor via an impedance element;

a voltage measurement unit configured to measure a voltage at a node between the coupling capacitor and the impedance element; and a leakage determination unit configured to determine whether or not a leakage has occurred between a current path of the power storage unit and the ground based on a peak-to-peak value between an upper peak value and a lower peak value of a voltage waveform of the voltage measured by the voltage measurement unit, wherein the leakage determination unit estimates at least one of an upper peak value and a lower peak value at a certain time, and calculates the peak-to-peak value between the upper peak value and the lower peak value with virtually aligned time axis.

2. The leakage detection device according to claim 1, wherein the leakage determination unit calculates a virtual lower peak value by averaging a voltage value measured at a time to be measured temporally immediately before a specific upper peak value and a voltage value measured at a time to be measured temporally immediately after the specific upper peak value, and calculates a peak-to-peak value between the specific upper peak value and the virtual lower peak value.

3. The leakage detection device according to claim 1, wherein the leakage determination unit calculates a virtual upper peak value by averaging a voltage value measured at a time to be measured temporally immediately before a specific lower peak value and a voltage value measured at a time to be measured temporally immediately after the specific lower peak value, and calculates a peak-to-peak value between the specific lower peak value and the virtual upper peak value.

4. The leakage detection device according to claim 1, wherein the leakage determination unit calculates a virtual upper peak value by weighted-averaging a plurality of voltage values measured at a plurality of times when an upper peak value is to be measured, calculates a virtual lower peak value aligned with a time axis of the virtual upper peak value by weighted-averaging a plurality of voltage values measured at a plurality of times when a lower peak value is to be measured, and calculates a peak-to-peak value between the virtual upper peak value and the virtual lower peak value.

5. The leakage detection device according to claim 1, wherein the leakage determination unit compares two adjacent peak-to-peak values to evaluate reliability of a leakage determination of a current path of the power storage unit, the peak-to-peak values each comprising the peak-to-peak value.

6. A power supply system for vehicle, the power supply system comprising:

the leakage detection device according to claim 1; and the power storage unit that is mounted in the state of being insulated from the chassis ground of the vehicle and is configured to supply power to the load in the vehicle.

7. A leakage detection device comprising:

in a state of being insulated from a ground, a coupling capacitor including a first end connected to a current path of a power storage unit connected to a load;

a voltage output unit configured to generate a periodic voltage that periodically changes to apply the periodic voltage to a second end of the coupling capacitor via an impedance element;

a voltage measurement unit configured to measure a voltage at a node between the coupling capacitor and the impedance element; and a leakage determination unit configured to determine whether or not a leakage has occurred between a current path of the power storage unit and the ground based on a peak-to-peak value between an upper peak value and a lower peak value of a voltage waveform of the voltage measured by the voltage measurement unit, wherein the leakage determination unit estimates at least one of a virtual upper peak value and a virtual lower peak value at a time to calculate the peak-to-peak value, and calculates the peak-to-peak value between the virtual upper peak value or the upper peak value at the time to calculate the peak-to-peak value, and the virtual lower peak value or the lower peak value to calculate the peak-to-peak value.

8. The leakage detection device according to claim 7, wherein the voltage measurement unit configured to measure the virtual upper peak value and the virtual lower peak value at a timing synchronized with a timing of an edge of the periodic voltage, and the leakage determination unit calculates the virtual lower peak value by averaging a voltage value measured at a time to be measured temporally before the upper peak value at the time to calculate the peak-to-peak value and a voltage value measured at a time to be measured temporally after the upper peak value, and calculates a peak-to-peak value.

9. The leakage detection device according to claim 7, wherein the voltage measurement unit configured to measure the virtual upper peak value and the virtual lower peak value at the timing synchronized with the timing of an edge of the periodic voltage, and the leakage determination unit calculates the virtual upper peak value by averaging a voltage value measured at a time to be measured temporally before the lower peak value at the time to calculate the peak-to-peak value and a voltage value measured at a time to be measured temporally after the lower peak value, and calculates a peak-to-peak value.

* * * * *